(12) United States Patent
Nie et al.

(10) Patent No.: US 9,472,684 B2
(45) Date of Patent: Oct. 18, 2016

(54) LATERAL GAN JFET WITH VERTICAL DRIFT REGION

(71) Applicant: AVOGY, INC., San Jose, CA (US)

(72) Inventors: Hui Nie, Cupertino, CA (US); Andrew Edwards, San Jose, CA (US); Isik Kizilyalli, San Francisco, CA (US); Dave Bour, Cupertio, CA (US); Thomas R. Prunty, Santa Clara, CA (US)

(73) Assignee: Avogy, Inc., San Jose, CA (US)

( * ) Notice: Subject to any disclaimer, the term of this patent is extended or adjusted under 35 U.S.C. 154(b) by 9 days.

(21) Appl. No.: 13/675,826

(22) Filed: Nov. 13, 2012

(65) Prior Publication Data

US 2014/0131721 A1 May 15, 2014

(51) Int. Cl.
| | |
|---|---|
| *H01L 29/808* | (2006.01) |
| *H01L 29/66* | (2006.01) |
| *H01L 29/10* | (2006.01) |
| *H01L 29/20* | (2006.01) |

(52) U.S. Cl.
CPC ....... *H01L 29/8083* (2013.01); *H01L 29/1066* (2013.01); *H01L 29/66909* (2013.01); *H01L 29/2003* (2013.01)

(58) Field of Classification Search
USPC .................................. 257/76, 263; 438/192
See application file for complete search history.

(56) References Cited

U.S. PATENT DOCUMENTS

| | | | |
|---|---|---|---|
| 2003/0089930 A1* | 5/2003 | Zhao | ............................ 257/256 |
| 2008/0124853 A1 | 5/2008 | Cheng et al. | |
| 2009/0078971 A1 | 3/2009 | Treu et al. | |
| 2009/0146182 A1 | 6/2009 | Hikita et al. | |
| 2010/0148184 A1 | 6/2010 | Takehiko et al. | |
| 2010/0320530 A1 | 12/2010 | Cheng | |
| 2012/0223340 A1 | 9/2012 | Sheridan et al. | |

FOREIGN PATENT DOCUMENTS

| | | |
|---|---|---|
| CN | 105103295 A | 11/2015 |
| DE | 10350160 A1 | 9/2005 |
| WO | 2008/037650 | 3/2008 |
| WO | 2014078238 A1 | 5/2014 |

OTHER PUBLICATIONS

International Search Report and Written Opinion from PCT/US2013/069469 mailed on Apr. 4, 2014, 12 pages.

* cited by examiner

*Primary Examiner* — Lynne Gurley
*Assistant Examiner* — Vernon P Webb
(74) *Attorney, Agent, or Firm* — Kilpatrick Townsend & Stockton LLP

(57) ABSTRACT

A gallium nitride (GaN)-based junction field-effect transistor (JFET) can include a GaN drain region having a top surface extending in a lateral dimension, a source region, and a GaN channel region of a first conductivity type coupled between the source region and the GaN drain region and operable to conduct electrical current between the source region and the GaN drain region. The JFET can also include a blocking layer disposed between the source region and the GaN drain region such that the GaN channel region is operable to conduct the electrical current substantially along the lateral dimension in a laterally-conductive region of the GaN channel region, and a GaN gate region of a second conductivity type coupled to the GaN channel region such that the laterally-conductive region of the GaN channel region is disposed between at least a portion of the blocking layer and the GaN gate region.

9 Claims, 12 Drawing Sheets

LATERAL GAN JFET WITH VERTICAL DRIFT REGION

BACKGROUND

Power electronics are widely used in a variety of applications. Power electronic devices are commonly used in circuits to modify the form of electrical energy, for example, from AC to DC, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY

The present invention relates generally to electronic devices. More specifically, the present invention relates to forming lateral junction gate field-effect transistors (JFETs) with vertical drift regions using III-nitride semiconductor materials. Merely by way of example, the invention has been applied to methods and systems for manufacturing a JFET power transistor using gallium-nitride (GaN) based epitaxial layers. The methods and techniques can utilize a blocking layer to direct current in a lateral direction.

An embodiment of a semiconductor device, according to the disclosure, can include a III-nitride substrate having a first conductivity type, a first III-nitride epitaxial layer, having the first conductivity type, coupled to the III-nitride substrate, and a blocking layer coupled to the first III-nitride epitaxial layer of the first conductivity type and having at least one opening. The semiconductor device can further include a second III-nitride epitaxial layer, having the first conductivity type, and coupled to the blocking layer, and the first III-nitride epitaxial layer through the at least one opening in the blocking layer. The semiconductor device can also include a third III-nitride epitaxial layer, having a second conductivity type, and coupled to the second III-nitride epitaxial layer such that at least a portion of the second III-nitride epitaxial layer is disposed between at least a portion of the third III-nitride epitaxial layer and at least a portion of the blocking layer to form a channel region, and a source region coupled to the second III-nitride epitaxial layer such that at least a portion of the channel region is disposed between the source region and the at least one opening in the blocking layer.

An embodiment of a method, according to the disclosure, includes providing a III-nitride substrate having a first conductivity type, and forming a first III-nitride epitaxial layer having the first conductivity type and coupled to the III-nitride substrate. The method can further include forming a blocking layer coupled to the first III-nitride epitaxial layer of the first conductivity type and having at least one opening, and forming a second III-nitride epitaxial layer, having the first conductivity type, coupled to the blocking layer, and the first III-nitride epitaxial layer through the at least one opening in the blocking layer. The method can also include forming a third III-nitride epitaxial layer, having a second conductivity type, and coupled to the second III-nitride epitaxial layer such that at least a portion of the second III-nitride epitaxial layer is disposed between at least a portion of the third III-nitride epitaxial layer and at least a portion of the blocking layer to form a channel region. Finally, the method can include forming an source region coupled to the second III-nitride epitaxial layer such that the channel region is disposed between the source region and the at least one opening in the blocking layer.

An embodiment of a gallium nitride (GaN)-based junction field-effect transistor (JFET), according to the disclosure, can include a GaN drain region having a top surface extending in a lateral dimension, a source region, and a GaN channel region of a first conductivity type coupled between the source region and the GaN drain region and operable to conduct electrical current between the source region and the GaN drain region. The GaN-based JFET can also include a blocking layer disposed between the source region and the GaN drain region such that the GaN channel region is operable to conduct the electrical current substantially along the lateral dimension in a laterally-conductive region of the GaN channel region. Finally, the GaN-based JFET can include a GaN gate region of a second conductivity type coupled to the GaN channel region such that the laterally-conductive region of the GaN channel region is disposed between at least a portion of the blocking layer and the GaN gate region.

Numerous benefits are achieved by way of the present invention over conventional techniques. For example, embodiments of the present invention allow for a high level of control over the doping density and/or width of the channel region of the lateral JFET using epitaxial control (rather than, for example, lithographical control). Also, majority of reverse electric field is dissipated over vertical drift layer, while transistor action is controlled by lateral channel. These and other embodiments of the invention, along with many of its advantages and features, are described in more detail in conjunction with the text below and attached figures.

DETAILED DESCRIPTION

Figure 1A:
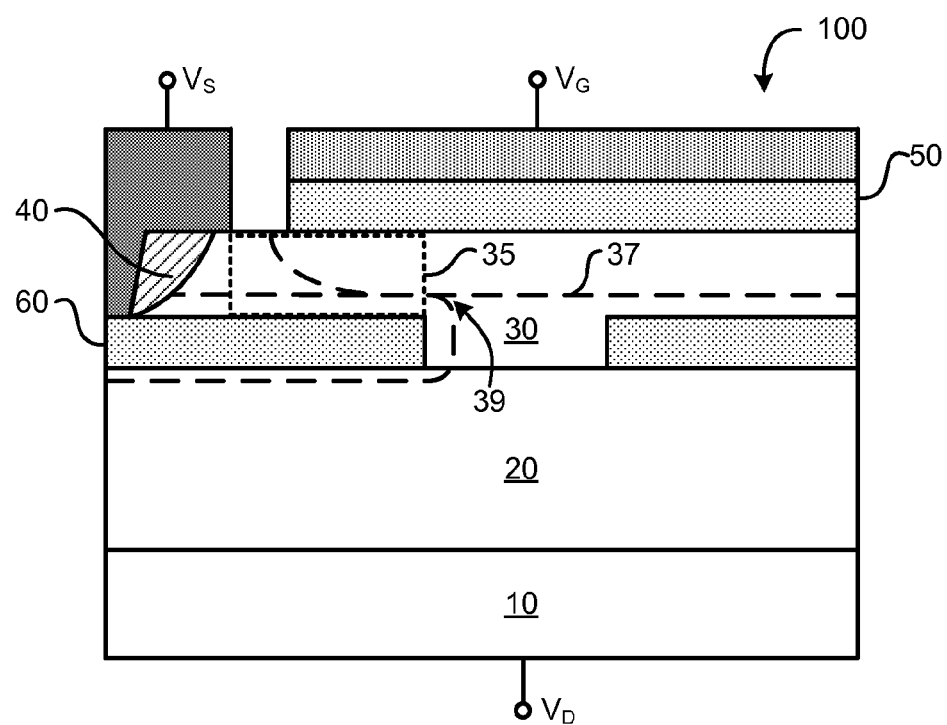
FIGS. 1A-1B are simplified cross-sectional diagrams illustrating the operational functionality of a lateral JFET according to an embodiment of the present invention.

The present invention relates generally to electronic devices. More specifically, the present invention relates to forming lateral junction gate field-effect transistors (JFETs) with vertical drift regions using III-nitride semiconductor materials. Merely by way of example, the invention has been applied to methods and systems for manufacturing a JFET power transistor using gallium-nitride (GaN) based epitaxial layers. The methods and techniques can utilize a blocking layer to direct current in a lateral direction.

GaN-based electronic and optoelectronic devices are undergoing rapid development, and generally are expected to outperform competitors in silicon (Si) and silicon carbide (SiC). Desirable properties associated with GaN and related alloys and heterostructures include high bandgap energy for visible and ultraviolet light emission, favorable transport properties (e.g., high electron mobility and saturation velocity), a high breakdown field, and high thermal conductivity. In particular, electron mobility, $\mu$, is higher than competing materials for a given background doping level, N. This provides low resistivity, ρ, because resistivity is inversely proportional to electron mobility, as provided by equation (1):

$$\rho = \frac{1}{q\mu N}, \qquad (1)$$

where q is the elementary charge.

Another superior property provided by GaN materials, including homoepitaxial GaN layers on bulk GaN substrates, is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by equation (2):

$$R = \rho L/A, \qquad (2)$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on bulk GaN substrates have low defect density compared to layers grown on mismatched substrates. The low defect density will give rise to superior thermal conductivity, less trap-related effects such as dynamic on-resistance, and better reliability.

In addition to vertical structures, a lateral JFET is also contemplated. Depending on doping levels, physical dimensions, conductivity type (e.g., n-type or p-type materials), and other factors, lateral JFETs can be designed to have normally-off or normally-on functionality. A normally-off lateral JFET is particularly useful due to its ability to prevent current flow if zero voltage is applied to the gate, which can serve as, among other things, a safety feature for lateral JFETs used in power applications.

A normally-off lateral JFET can be created in various ways. For example, an n-type current path from source to drain can be gated by p+ gates. With sufficiently low background doping, and high positive charge due to high hole concentration in the p+ gates, the channel can be depleted of carriers, or pinched off at zero bias. When a positive voltage is applied to the gate(s), the channel can be re-opened to turn the device on. As detailed herein below, embodiments of the present invention can include a blocking layer and a gate that directs the current in a lateral direction for at least a portion of the current path. Thus, the lateral JFET is referred to as a lateral junction field effect transistor since at least a portion of the current is directed to flow laterally.

In addition to the ability to support high-voltage, low-resistance JFET applications, the lateral JFET described herein can differ from a traditional lateral JFET in other ways. The use of GaN epitaxial layers can allow for non-uniform dopant concentrations as a function of thickness within the various layers of the lateral JFET, which can optimize the performance of the device.

Figure 1B:
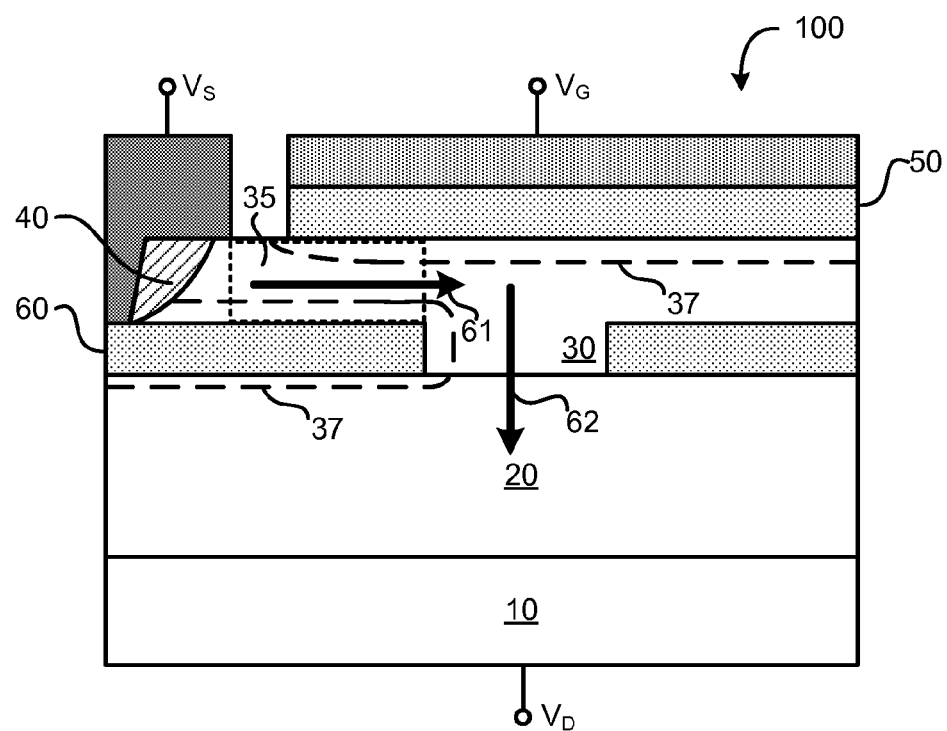

FIGS. 1A-1B are simplified cross-sectional diagrams illustrating the operational functionality of a lateral JFET 100 according to an embodiment. Referring to FIG. 1A, a drain region 10 is provided. According to the embodiment of the present invention illustrated in FIG. 1A, the substrate is an n-type GaN substrate, but the present invention is not limited to this particular material. In other embodiments, substrates with p-type doping are utilized.

Additionally, although a GaN substrate is illustrated in FIG. 1A, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, and quaternary III-V (e.g., III-nitride) materials such as AlInGaN are included within the scope of the present invention.

Additionally, embodiments can use materials having an opposite conductivity type to provide devices with different functionality. For example, embodiments provided herein focus on the formation of a lateral JFET with an n-type drain and channel regions. However, a p-type lateral JFET can be formed by using materials with opposite conductivity (e.g., substituting p-type materials for n-type materials, and vice versa) in a similar manner as will be evident to one of skill in the art.

Coupled to the drain region 10, is a drift region 20 of n-type GaN material. The drift region 20 provides a medium through which current can flow (in the lateral JFET's on-state) in a vertical direction between the drain region 10 and a channel region 30 coupled to the drift region 20. In the off-state, the drift region 20 provides a medium for supporting the electric field created by the voltage gradient between the source or gate and the drain. The channel region 30 also can comprise an n-type GaN material that can be thick enough to minimize added resistance when the lateral JFET 100 is turned on, but thin enough to provide adequate current pinch off when the lateral JFET 100 is turned off. The channel region 30 is coupled to a source region 40 comprising a heavily-doped, n-type GaN material and a gate region 50 comprising p-type GaN material. Both source region 40 and gate region 50 can have metal contacts to which respective voltages, $V_S$ and $V_G$, can be applied. The drain region 10 can also have a metal contact (not shown) to which a drain voltage, $V_D$, can be applied.

The lateral JFET 100 can include a blocking layer 60 comprising p-type GaN and/or insulating material, which can block an electrical field and electrical current in the n-type GaN material of the channel region 30. Thus, the blocking layer 60, together with the gate region 50, can channel current through a laterally-conductive region 35 of the channel region 30. The p-type GaN material of the gate region 50 and the blocking layer 60 form p-n junctions with corresponding depletion regions 37 when coupled with the n-type materials of the channel region 30 and drift region 20. Alternatively, the p-type GaN material of the gate region 50 can be electrically tied to the blocking layer 60 to form buried p-type gate as well.

The operation of the lateral JFET 100 is described as follows. FIG. 1A shows the lateral JFET turned off, which can be a default mode of operation (e.g., $V_G=0$ V). As illustrated in FIG. 1A, the depletion regions 37 overlap at a location 39 in the channel, preventing current flow through the channel region from the drain region 10 to the source region 40.

FIG. 1B shows the lateral JFET turned on, meaning the depletion regions 37 are separated, allowing current to flow substantially along a lateral dimension 61 in the laterally-conductive region 35 and substantially along a vertical dimension 62 in another portion of the channel region 30 and/or the drift region 20 when voltages $V_D$ and $V_S$ are applied to the drain region 10 and source region 40, respectively. In this embodiment, application of a voltage $V_G$ applied to the gate region 50 turns on the lateral JFET 100 by decreasing the size of the gate's depletion region 37 and thereby providing a current path through the channel region 30.

Whether the lateral JFET 100 is normally-on or normally off can depend on different features of the lateral JFET 100, such as the thickness of the channel region 30, dopant concentrations in the channel region 30 and the gate region 50, or the like. For example, a normally-on lateral JFET can be formed if the channel region is sufficiently wide and/or the dopant concentrations are high enough, in which case the depletion regions 37 may not pinch off the current when voltage $V_G$ applied to the gate region 50 is 0 V. The normally-on lateral JFET 100 can be turned off when $V_G$ reaches a negative threshold voltage. Alternatively, for a normally-off lateral JFET, the channel is pinched off when $V_G$ is 0 V, and the normally-off lateral JFET 100 can be turned on when $V_G$ reaches a positive threshold voltage.

FIGS. 2-11 are simplified cross-sectional diagrams that illustrate a process for manufacturing a lateral JFET, according to one embodiment.

Figure 2:
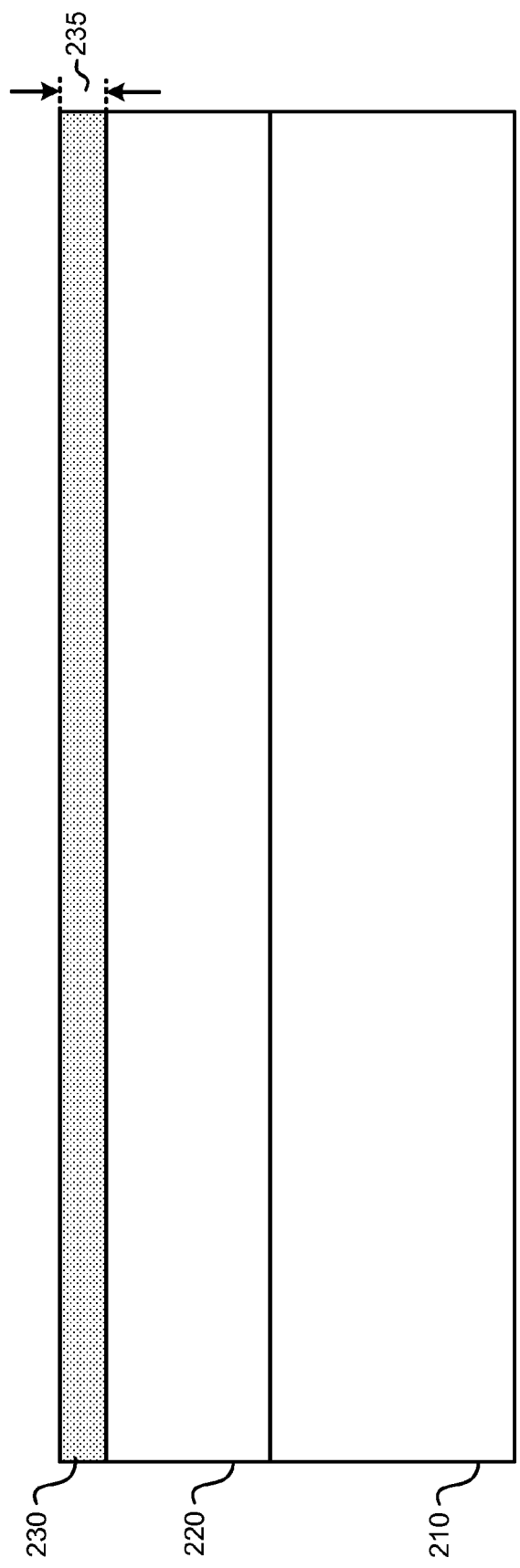
FIGS. 2-11 are simplified cross-sectional diagrams that illustrate a process for manufacturing a lateral JFET, according to one embodiment.

Referring to FIG. 2, a first GaN epitaxial layer 220 is formed on a GaN substrate 210. The GaN substrate 210 can be a pseudo-bulk GaN material on which the first GaN epitaxial layer 220 is grown. Dopant concentrations (e.g., doping density) of the GaN substrate 210 can vary. For example, a GaN substrate 210 can have an n+ conductivity type, with dopant concentrations ranging from $1 \times 10^{17}$ cm$^{-3}$ to $1 \times 10^{19}$ cm$^{-3}$. Although the GaN substrate 210 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

The properties of the first GaN epitaxial layer 220 can also vary, depending on desired functionality. The first GaN epitaxial layer 220 can serve as a drift region for the lateral JFET 100, and therefore can be a relatively low-doped material. For example, the first GaN epitaxial layer 220 can have an n− conductivity type, with dopant concentrations between $1 \times 10^{14}$ cm$^{-3}$ to $1 \times 10^{18}$ cm$^{-3}$. Furthermore, the dopant concentration can be uniform, or can vary, for example, as a function of the thickness of the drift region.

The thickness of the first GaN epitaxial layer 220 can also vary substantially, depending on the desired functionality. As discussed above, homoepitaxial growth can enable the first GaN epitaxial layer 220 to be grown far thicker than layers formed using conventional methods. In general, in some embodiments, thicknesses can vary between 0.5 μm and 100 μm, for example, thicknesses greater than 5 μm. Resulting breakdown voltages for the lateral JFET 100 can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN epitaxial layers and structures disclosed herein. For example, n-type dopants can include silicon, oxygen, germanium or the like. P-type dopants can include magnesium, beryllium, zinc, carbon or the like.

A blocking layer 230 can be formed on the first GaN epitaxial layer 220. The blocking layer 230 can be a resistive semiconductor layer comprising any of a variety of materials that can serve to block electrical field and/or current flowing through the subsequently-formed channel region. For example, the blocking layer 230 can comprise GaN, AlGaN, InGaN, and/or other high-band-gap materials. Additionally or alternatively, the blocking layer 230 can include an insulating material, such as AlN. For embodiments in which the first GaN epitaxial layer 220 has n-type conductivity, the blocking layer 230 can have p-type conductivity. In some embodiments, a dopant concentration of the blocking layer 230 can be between $5 \times 10^{16}$ cm$^{-3}$ to $1 \times 10^{20}$ cm$^{-3}$, and a thickness 235 of the blocking layer 230 can be between 100 nm and 1000 nm. In other embodiments, dopant concentrations and/or thicknesses can be higher or lower.

Figure 3:
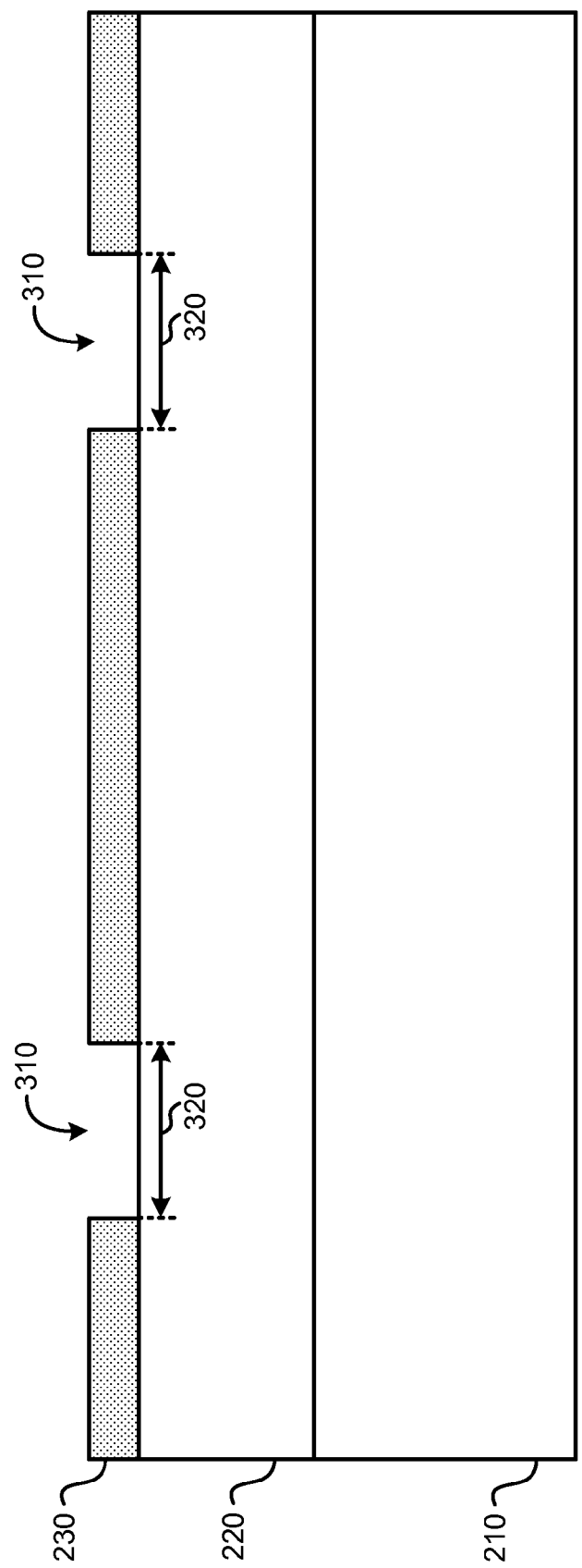

FIG. 3 shows how one or more portions of the blocking layer 230 can be removed to form one or more openings 310 in the blocking layer 230. The opening(s) 310 can be formed using dry and/or wet etching steps, which may utilize the use of photolithographic processes and/or etch masks.

The width 320 of the opening(s) 310 can vary depending on desired functionality. The width 320 defines a current pathway from the first GaN epitaxial layer 220 (drift region) to the subsequently-formed channel region, and can present a tradeoff in the design of the lateral JFET. If the width 320 is relatively large, it can help ensure a relatively low-resistive path for electrical current, but it may be more difficult to pinch off and reduce transistor area packing density. Conversely, if the width 320 is relatively small, resistivity may be higher, but the electrical current may be easier to pinch off. In some embodiments, the width 320 can be anywhere from 200 nm to 4 microns. Other embodiments may include widths outside this range. Additionally or alternatively, embodiments may include different widths 320 for different openings 310.

Figure 4:
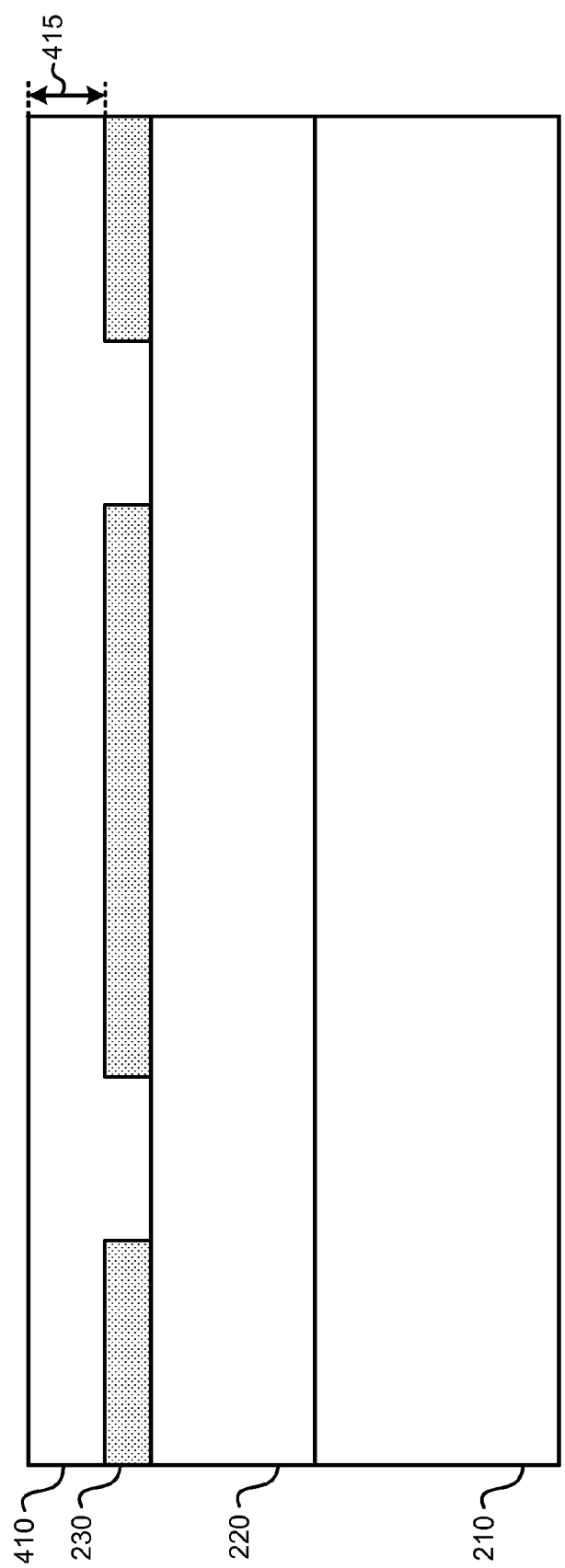

FIG. 4 illustrates the formation of a second GaN epitaxial layer 410 coupled to the blocking layer 230. The second GaN epitaxial layer 410, which eventually comprises the channel of the lateral JFET 100, is also coupled to the first GaN epitaxial layer 220 through the opening(s) 310, thereby creating a pathway in which electrical current can travel through the lateral JFET. Additionally, the second GaN epitaxial layer 410 can be the same conductivity type as the first GaN epitaxial layer 220. In some embodiments, the second GaN epitaxial layer 410 can have a higher dopant concentration than the first GaN epitaxial layer 220.

The second GaN epitaxial layer 410 can be formed using an epitaxial regrowth process. This can allow for a high level of control over the doping and the thickness 415 of the laterally-conductive region of the lateral-JFET's channel, as compared with other techniques. In some embodiments, a dopant concentration of the second GaN epitaxial layer 410 can be between $1 \times 10^{16}$ cm$^{-3}$ to $1 \times 10^{18}$ cm$^{-3}$, and a thickness 415 of the of the laterally-conductive region (i.e., the region of the second GaN epitaxial layer 410 above the blocking layer 230) can be between 25 nm and 1 micron. In other embodiments, the thickness 415 of the laterally-conductive region is between 100 nm and 500 nm. In yet other embodiments, dopant concentrations and/or thicknesses can be higher or lower. Furthermore, as discussed in relation to the first GaN epitaxial layer 220 (and is as applicable to subsequent layers), adhesion layers, buffer layers, and the like, can be utilized during the epitaxial growth as appropriate to the particular device structure fabricated.

Figure 5:
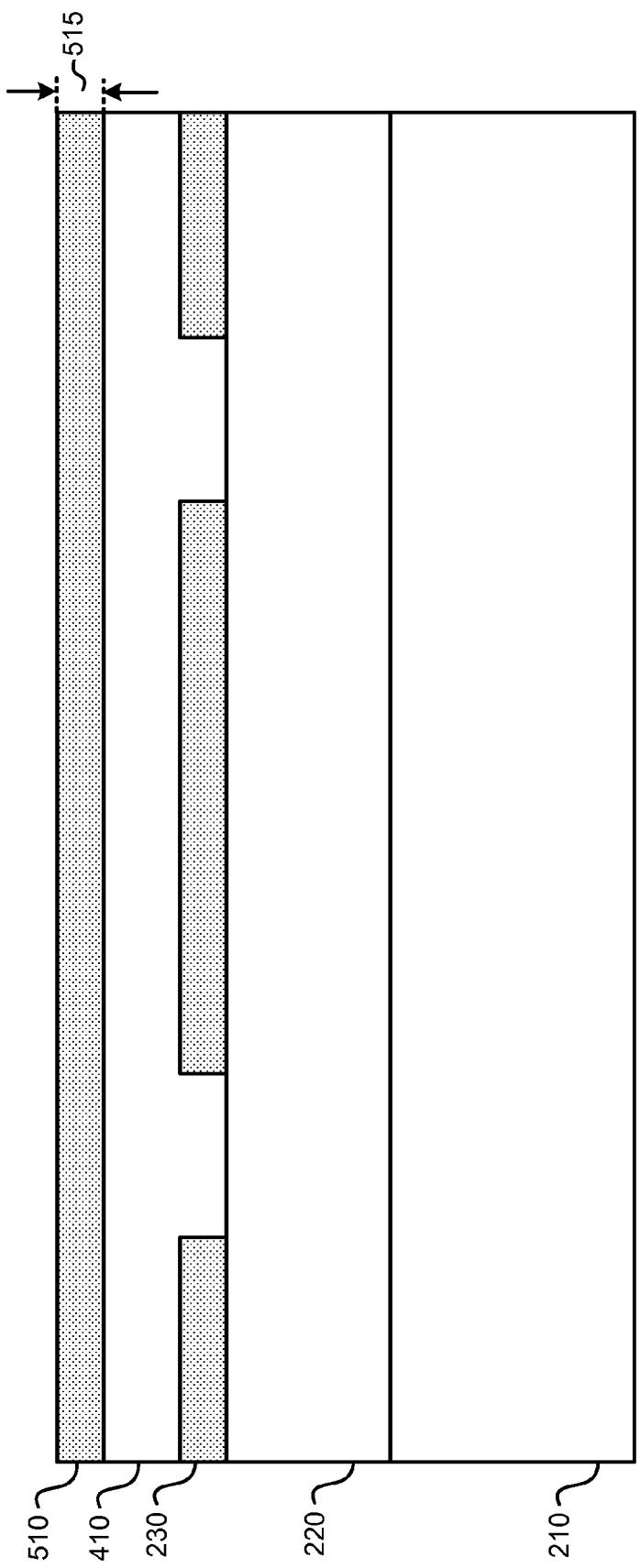

FIG. 5 illustrates the formation of a third GaN epitaxial layer 510 coupled to the second GaN epitaxial layer 410. The third GaN epitaxial layer 510 has a conductivity type opposite that of the second GaN epitaxial layer 410. For instance, if the second GaN epitaxial layer 410 is formed from an n-type GaN material, the third GaN epitaxial layer 510 can be formed from a p-type GaN material, and vice versa. In some embodiments (not shown), the third GaN epitaxial layer 510 is formed by a selective epitaxial regrowth process in which the third GaN epitaxial layer 510 is formed over the exposed portions of the second GaN epitaxial layer 410, but the third GaN epitaxial layer 510 is not formed on areas protected by a regrowth mask. Other embodiments, as shown in FIG. 5, can form the third GaN epitaxial layer 510 uniformly.

The third GaN epitaxial layer 510, which forms the gate of the lateral JFET, can vary in doping density and thickness depending on desired functionality. That said, the thickness of the third GaN epitaxial layer 510 may not be critical in some embodiments, as long as it provides gate functionality (i.e., current pinch off) to the channel region of the lateral JFET. In some embodiments, the thickness 515 of the third GaN epitaxial layer 510 can be between 50 nm to 1 micron.

One method of forming the third GaN epitaxial layer 510, and other layers described herein, can be through a regrowth process that uses an in-situ etch and diffusion preparation processes. These preparation processes are described in U.S. patent application Ser. No. 13/198,666, filed on Aug. 4, 2011, entitled "METHOD AND SYSTEM FOR FORMATION OF P-N JUNCTIONS IN GALLIUM NITRIDE BASED ELECTRONICS," which is incorporated by reference herein in its entirety.

Figure 6:
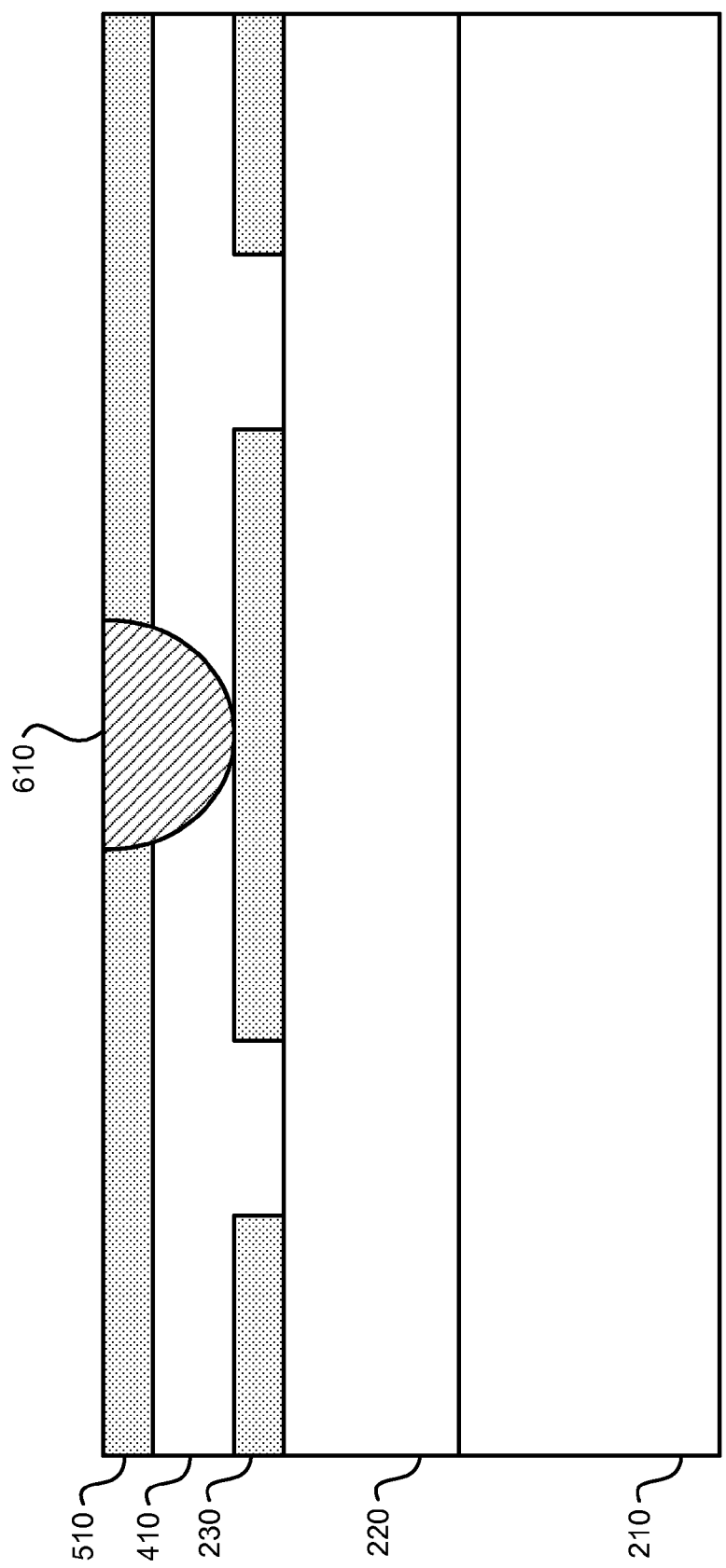

FIG. 6 illustrates the formation of an implanted region 610 formed in the second and third GaN epitaxial layers 410, 510. The implanted region 610 serves as a source of the lateral JFET. Where the second GaN epitaxial layer 410 has n-type conductivity, an n-type dopant, such as Si, is introduced into the GaN by ion implantation. The entire wafer surface is bombarded by Si ions, for example, accelerated to achieve energies which can range from 20 keV to 600 keV or higher. The implanted region 610 is defined by a mask (not shown) which blocks portions of the surface where the implant is not desired and has openings where the implant is allowed to pass. The mask may consist of photoresist, dielectric layers such as silicon oxide or silicon nitride or other materials such as Ni or Cr, for example, or some combination thereof. Other embodiments may form the source using a different process, such as by etching a portion the second and third GaN epitaxial layers 410, 510 and/or forming the source using an epitaxial regrowth process. One of ordinary skill in the art would recognize many variations, modifications, and alternatives.

Figure 7:
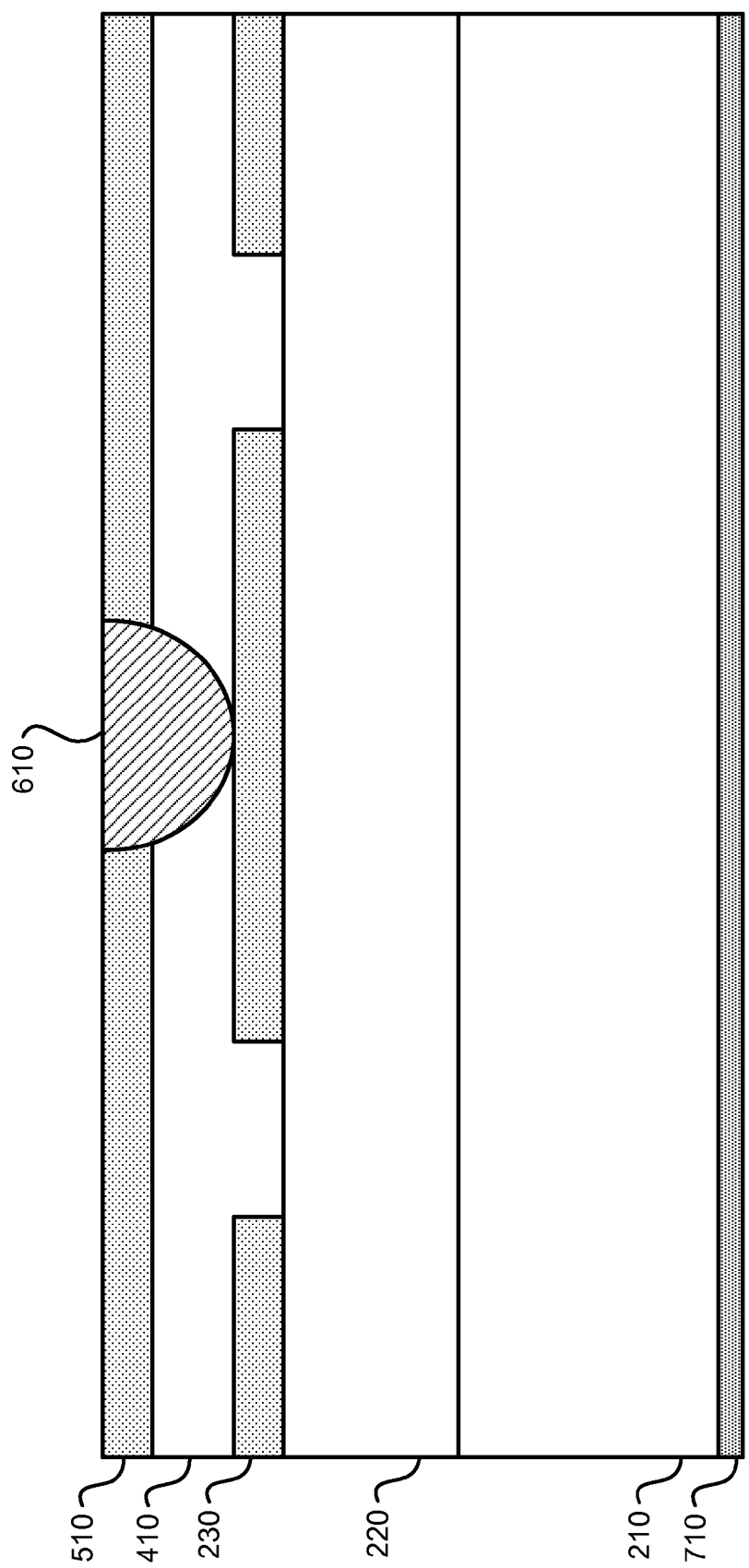

FIG. 7 illustrates the formation of a backside metal 710 can formed on a surface of the GaN substrate 210 opposing a surface of the GaN substrate 210 coupled with the first GaN epitaxial layer 220. The backside metal 710 can serve as the drain electrode of the lateral JFET. The backside metal 710 may comprise one or more layers of metal that provide good Ohmic contact to the GaN substrate 210. The backside metal 710 can comprise a titanium-aluminum (Ti/Al) ohmic metal. Other metals and/or alloys can be used including, but not limited to, aluminum, nickel, gold, palladium, silver combinations thereof, or the like. In some embodiments, an outermost metal of the backside metal 710 can include gold, tantalum, tungsten, palladium, silver, or aluminum, combinations thereof, and the like. The backside metal 710 can be formed using any of a variety of methods such as sputtering, evaporation, or the like.

Figure 8:
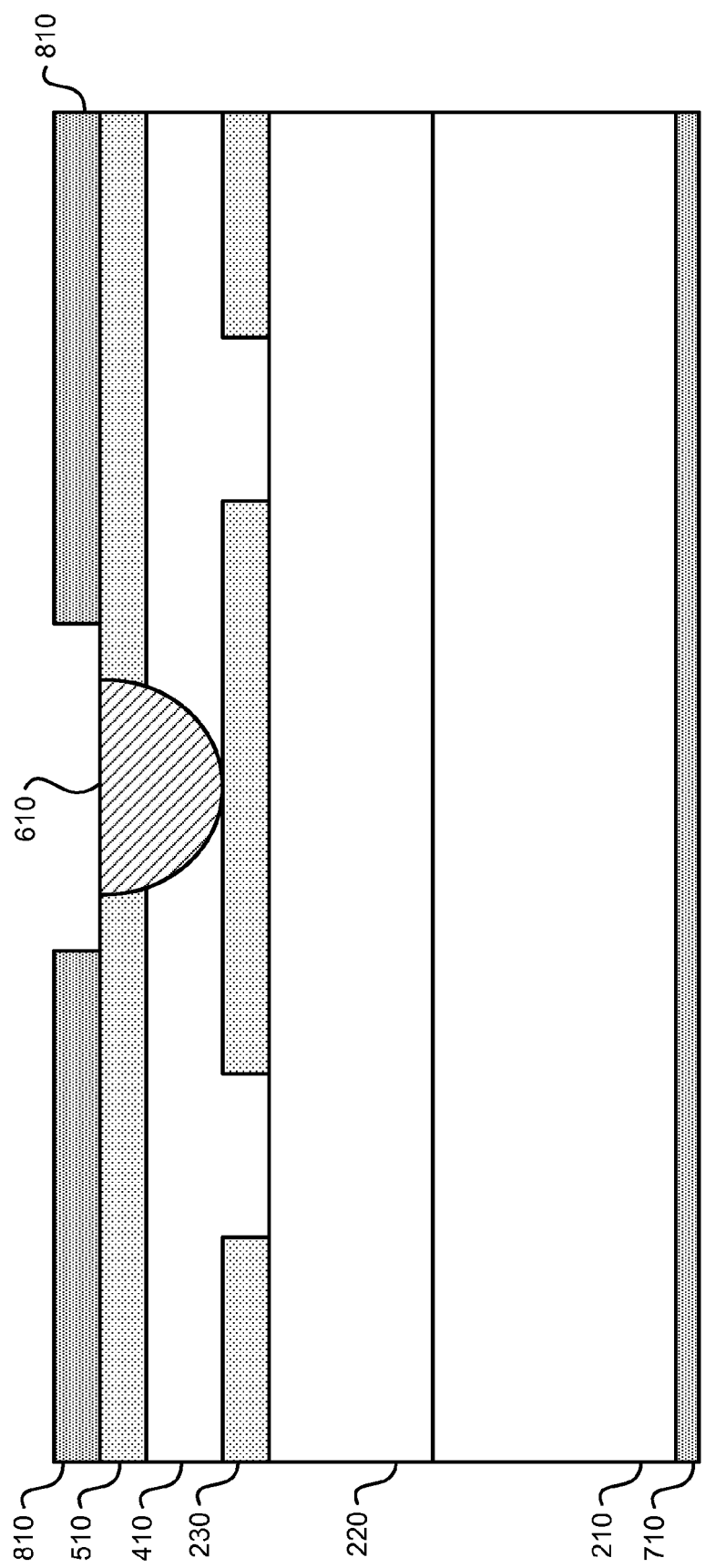

FIG. 8 shows the formation of a p-ohmic metallization layer 810. P-ohmic metallization layer 810 can comprise one or more metals that makes a good Ohmic contact to the p-type GaN of the third GaN epitaxial layer 510, such as platinum, palladium, nickel, and/or other suitable materials. P-ohmic metallization layer 810 may be patterned by lift-off processing or by photolithography and etching steps.

Figure 9:
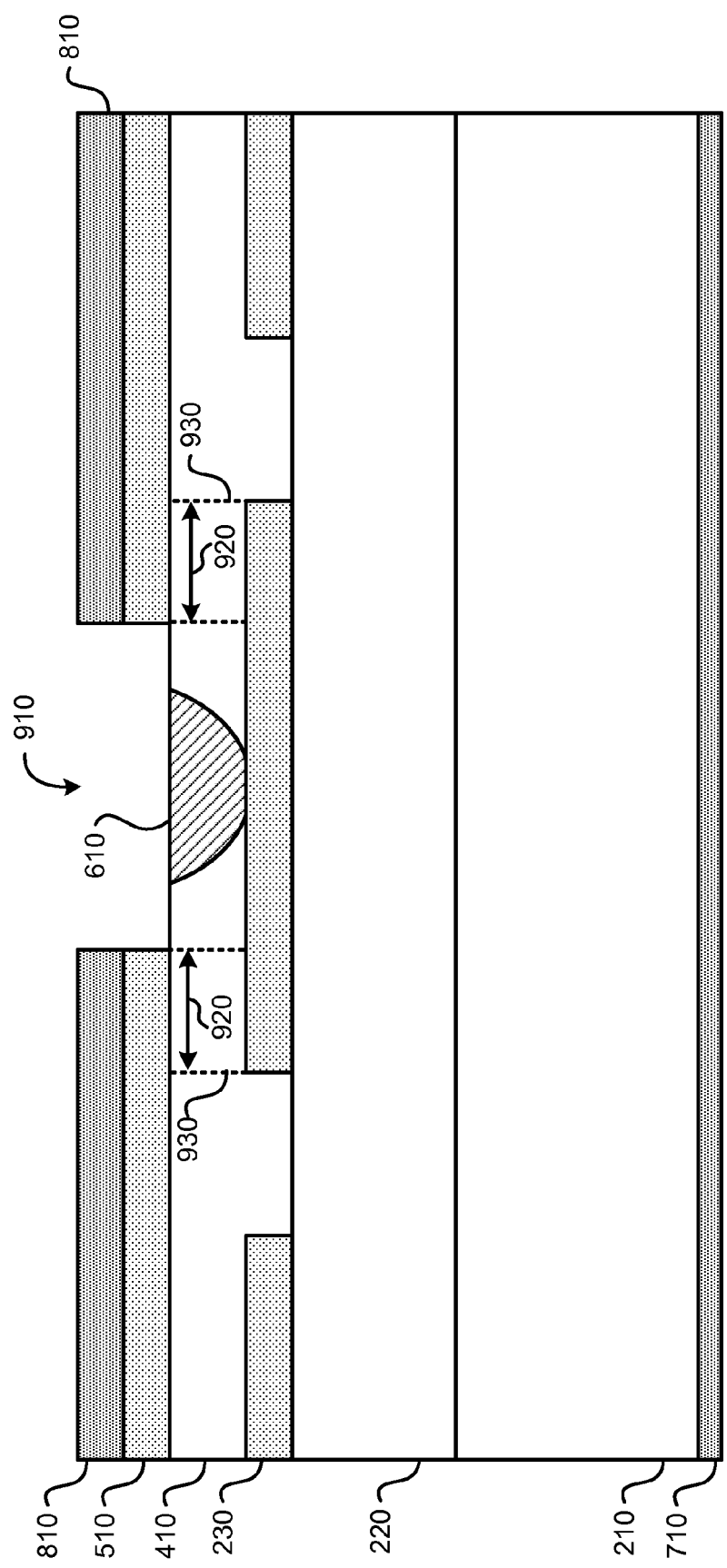

FIG. 9 illustrates the removal of a portion of the third GaN epitaxial layer 510 to form an opening 910. The removal process can also remove a portion of the implanted region 610 and/or second GaN epitaxial layer 410. In some embodiments this removal step comprises an etching step can utilize the p-ohmic metallization layer 810 as an etch mask. Thus, no additional photolithography may be required. Instead, an etching process is chosen that removes the exposed portions of the third GaN epitaxial layer 510 without substantially etching either the p-ohmic metallization layer 810. For example, an inductively-coupled plasma (ICP) etching step may be used. After the portion of the third GaN epitaxial layer 510 is removed, the implanted region 610 and/or second GaN epitaxial layer 410 is exposed. Other embodiments may utilize other dry and/or wet etching processes.

The removal of the portion of the third GaN epitaxial layer 510 also defines the length(s) 920 of one or more laterally conducting regions 930 of the second GaN epitaxial layer 410. The length(s) 920 can vary depending on desired functionality, manufacturing concerns, and/or other factors. In some embodiments, the length(s) 920 can be between 500 nm to 1 micron. Other embodiments may have length(s) 920 smaller than 500 nm and/or larger than 1 micron. Furthermore, a lateral JFET with multiple laterally conducting regions 930 may have different lengths 920 for different laterally conducting regions 930.

Figure 10:
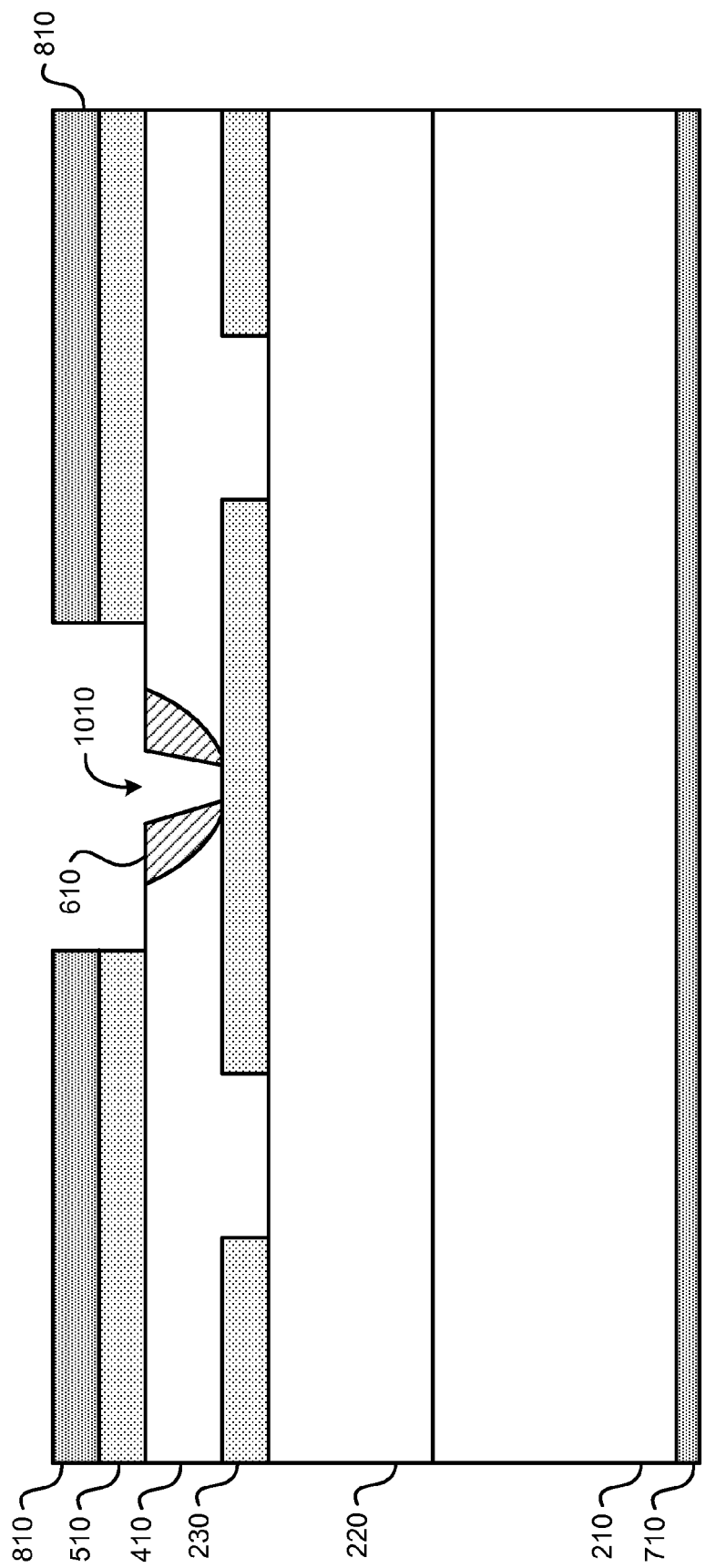

FIG. 10 illustrates the formation of an opening 1010 in the implanted region 610 that can expose a surface of at least a portion of the blocking layer 230. The opening 1010 can be made by utilizing a wet and/or dry etch. Depending on the type of etch and/or other removal process, a portion of the blocking layer 230 may also be removed.

Figure 11:
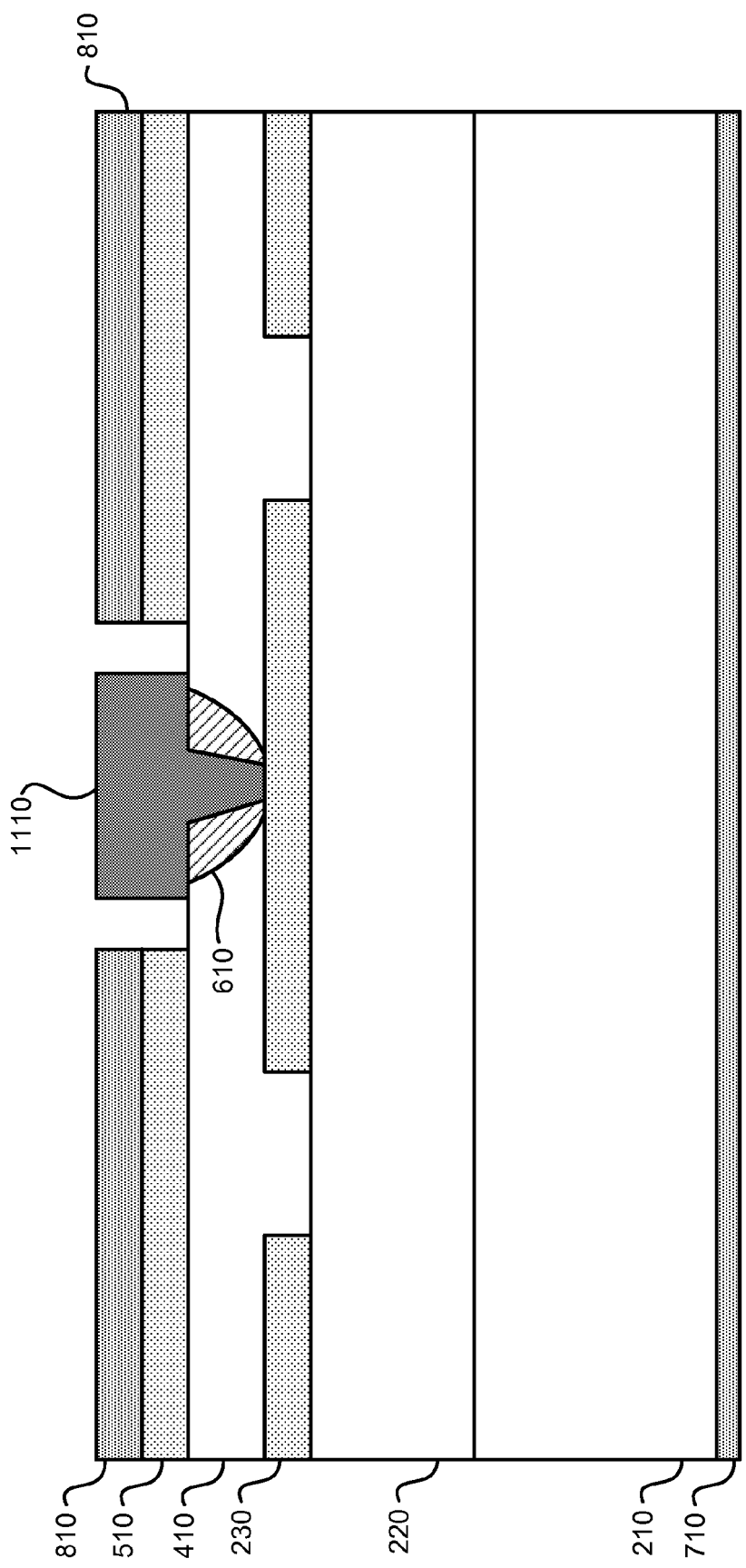

FIG. 11 illustrates the formation of a metal structure 1110 coupled to the implanted region 610 and the blocking layer. The metal structure 1110 can serve as the source electrode of the lateral JFET, as well as an electrical contact to the blocking layer 230 to prevent the blocking layer from floating. In alternative embodiments, the blocking layer 230 may be electrically connected with the third GaN epitaxial layer 510. The metal structure 1110 may comprise one or more layers of metal that provide good Ohmic contact to the implanted region 610. The metal structure 1110 can comprise, for example, a titanium-aluminum (Ti/Al) ohmic metal. Other metals and/or alloys can be used including, but not limited to, vanadium, scandium, aluminum, nickel, gold, combinations thereof, or the like. In some embodiments, an outermost metal of the metal structure 1110 can include gold, tantalum, tungsten, palladium, silver, or aluminum, combinations thereof, and the like. The metal structure 1110 can be formed using any of a variety of methods such as sputtering, evaporation, or the like.

Figure 12:
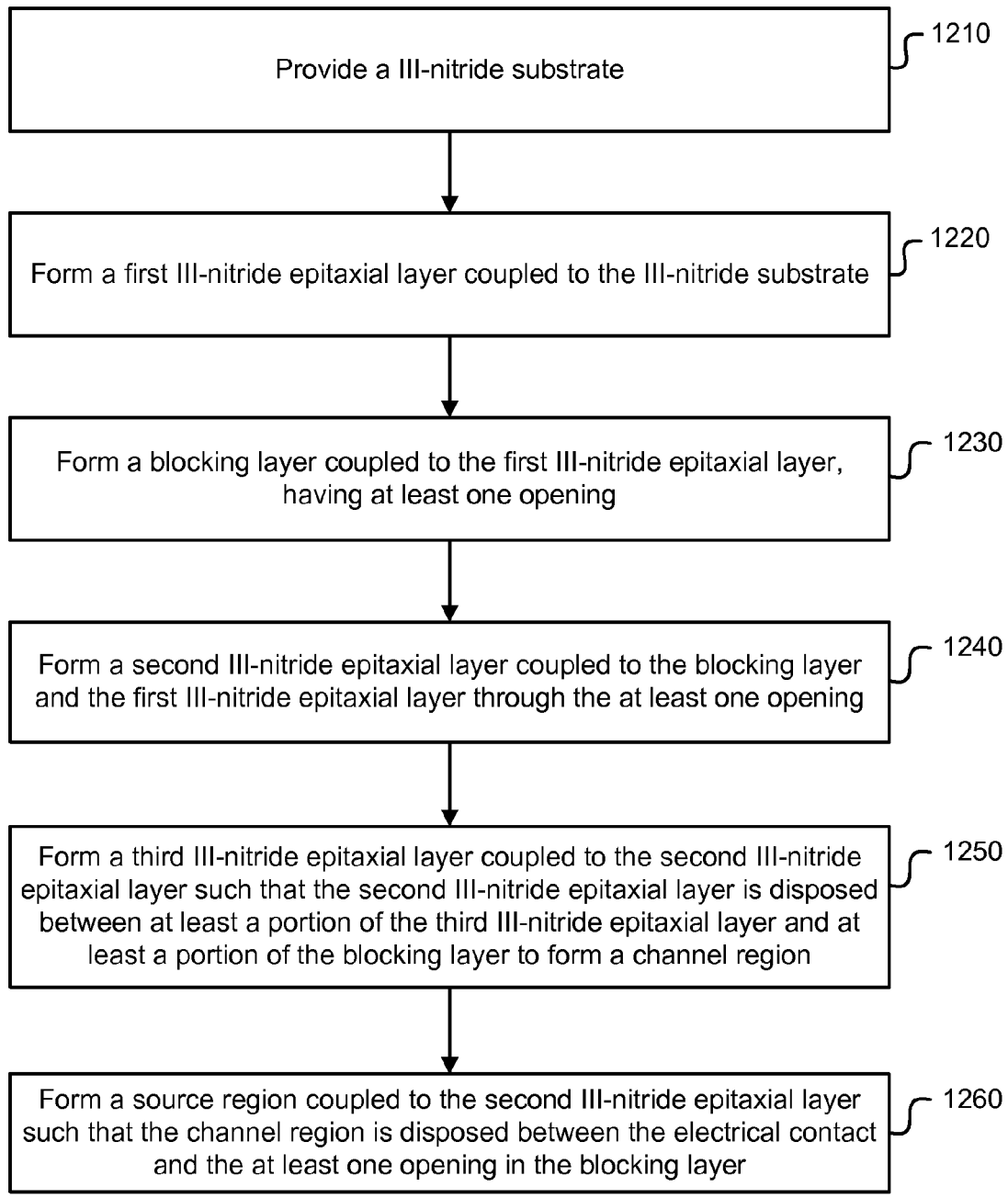
FIG. 12 is a simplified flowchart illustrating a method of fabricating a lateral JFET, according to an embodiment of the present invention.

FIG. 12 is a simplified flowchart illustrating a method of fabricating a lateral JFET, according to an embodiment of the present invention. The method includes providing a III-nitride substrate (1210). In an embodiment, the III-nitride is an n-type GaN substrate. The method also includes forming a first III-nitride epitaxial layer coupled to the III-nitride substrate (1220). The first III-nitride epitaxial layer may be formed using epitaxial regrowth, and can have the same conductivity as the III-nitride substrate.

The method also includes forming a blocking layer coupled to the first III-nitride epitaxial layer and having at least one opening (1230). As indicated previously, the blocking layer can comprise a III-nitride epitaxial layer, such as GaN, AlGaN, InGaN, and/or another high band-gap material, having an opposite conductivity as the first III-nitride epitaxial layer. For example, if the first III-nitride epitaxial layer has n-type conductivity, the blocking layer could have p-type conductivity. In some embodiments, an insulating material (e.g., a dielectric such as AlN) can be used in addition or as an alternative to a III-nitride or other semiconductor material.

The blocking layer blocks vertical electrical field and/or current flow in at least some areas of the lateral JFET, causing the electrical current to flow in a substantially lateral direction in at least a portion of a subsequently-formed channel region when turned on. In other words, for a lateral JFET having a drain region with a top surface extending along a lateral dimension, the electrical current can flow substantially along the lateral dimension in the laterally-conductive region. Where the blocking layer has an opening the current is able to travel in along a vertical dimension.

The method further includes forming a second III-nitride epitaxial layer coupled to the blocking layer and the first III-nitride epitaxial layer through the at least one opening (1240). The second III-nitride epitaxial layer, which forms the channel region for the lateral JFET, can have the same conductivity type as the first III-nitride epitaxial layer. In some embodiments, the doping density (i.e., dopant concentration) for the second III-nitride epitaxial layer can be equal to or less than the first III-nitride epitaxial layer. Because the second III-nitride epitaxial layer can be formed using epitaxial regrowth, the width and doping of the laterally-conductive portion of the channel can be controlled with a high degree of accuracy.

A third III-nitride epitaxial layer is formed, coupled to the second III-nitride epitaxial layer such that at least a portion of the second III-nitride epitaxial layer is disposed between at least a portion of the third III-nitride epitaxial layer and at least a portion of the blocking layer to form a channel region (1250). The third III-nitride epitaxial layer forms a gate region that can have the opposite conductivity type as the second III-nitride epitaxial layer (and channel region) to create a depletion region that can be adjusted to pinch off electrical current in the channel region or allow electrical current to pass through the channel region.

The method also includes forming a source layer coupled to the second III-nitride epitaxial layer such that the channel region is disposed between the electrical contact and the at least one opening in the blocking layer (1260). In some embodiments, the source region can comprise an implanted region of the second III-nitride epitaxial layer.

In some embodiments, other steps can be included. For example, the source region and/or blocking region can be coupled with a metal structure forming a source electrode. Moreover, the III-nitride substrate and/or third III-nitride epitaxial layers can also be coupled with electrodes. As shown in FIGS. 2-11, the blocking layer can include a plurality of openings, thereby enabling the lateral JFET to have a channel region for each of the plurality of openings.

It should be appreciated that the specific steps illustrated in FIG. 12 provide a particular method of fabricating a lateral JFET according to an embodiment of the present invention. Other sequences of steps may also be performed according to alternative embodiments. For example, alternative embodiments of the present invention may perform the steps outlined above in a different order. Moreover, the individual steps illustrated in FIG. 12 may include multiple sub-steps that may be performed in various sequences as appropriate to the individual step. Furthermore, additional steps may be added or removed depending on the particular applications. One of ordinary skill in the art would recognize many variations, modifications, and alternatives.

One of ordinary skill in the art would also recognize many variations, modifications, and alternatives to the examples provided herein. As illustrated herein, contacts, III-nitride layers, metal layers, and/or various other components and/or regions of the semiconductor devices described herein can be provided in any of a variety of shapes and forms, depending on physical features of the semiconductor device. Additionally or alternatively, conductivity types of the examples provided herein can be reversed (e.g., replacing an n-type semiconductor material with a p-type material, and vice versa), depending on desired functionality. Moreover, embodiments provided herein using GaN can use other III-nitride materials in addition or as an alternative to GaN. Other variations, alterations, modifications, and substitutions are contemplated.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor device comprising:
a III-nitride substrate having a first conductivity type;
a first III-nitride epitaxial layer, having the first conductivity type, in physical contact with the III-nitride substrate;
a blocking layer in direct contact with the first III-nitride epitaxial layer of the first conductivity type and having at least one opening;
a second III-nitride epitaxial layer, having the first conductivity type, and in direct contact with:
the blocking layer, and
the first III-nitride epitaxial layer through the at least one opening in the blocking layer;
a third III-nitride epitaxial layer, having a second conductivity type, and in direct contact with the second III-nitride epitaxial layer such that at least a portion of the second III-nitride epitaxial layer is disposed between at least a portion of the third III-nitride epitaxial layer and at least a portion of the blocking layer to form a channel region; and
a source region in direct contact with the second III-nitride epitaxial layer such that at least a portion of the channel region is disposed between the source region and the at least one opening in the blocking layer; and
a metal structure direct contact with the source region and at least a portion of the blocking layer, the metal structure forming an ohmic contact with the source region.

2. The semiconductor device of claim 1 wherein the source region comprises an implanted region of the second III-nitride epitaxial layer.

3. The semiconductor device of claim 1 further comprising a metal layer in direct contact with the third III-nitride epitaxial layer.

4. The semiconductor device of claim 1 further comprising a metal layer in direct contact with the III-nitride substrate.

5. The semiconductor device of claim 1 wherein:
the blocking layer includes a plurality of openings;
the second III-nitride epitaxial layer is in direct contact with the first III-nitride epitaxial layer through each of the plurality of openings in the blocking layer; and the source region is in direct contact with the second III-nitride epitaxial layer such that, for each of the plurality of openings in the blocking layer, a respective channel region is disposed between the source region and the opening in the blocking layer.

6. The semiconductor device of claim 1 wherein the blocking layer comprises III-nitride epitaxial structure, having the second conductivity type.

7. A gallium nitride (GaN)-based junction field-effect transistor (JFET) comprising:
- a GaN drain region having a top surface extending in a lateral dimension;
- a source region;
- a GaN channel region of a first conductivity type coupled between the source region and the GaN drain region and operable to conduct electrical current between the source region and the GaN drain region;
- a blocking layer disposed between the source region and the GaN drain region such that the GaN channel region is operable to conduct the electrical current substantially along the lateral dimension in a laterally-conductive region of the GaN channel region; and
- a GaN gate region of a second conductivity type in physical contact with the GaN channel region such that the laterally-conductive region of the GaN channel region is disposed between at least a portion of the blocking layer and the GaN gate region; and
- a metal structure forming an ohmic contact with the source region and at least a portion of the blocking layer.

8. The GaN-based JFET of claim 7 further comprising a metal layer in direct contact with the GaN gate region.

9. The GaN-based JFET of claim 7 wherein the blocking layer comprises a GaN epitaxial structure of the second conductivity type.

* * * * *